(12) United States Patent
Shibib

(10) Patent No.: US 6,228,750 B1
(45) Date of Patent: May 8, 2001

(54) METHOD OF DOPING A SEMICONDUCTOR SURFACE

(75) Inventor: Muhammed Ayman Shibib, Wyomissing Hills, PA (US)

(73) Assignee: Lucent Technologies, Murray Hill, NJ (US)

( * ) Notice: Subject to any disclaimer, the term of this patent is extended or adjusted under 35 U.S.C. 154(b) by 0 days.

(21) Appl. No.: 09/000,930

(22) Filed: Dec. 30, 1997

Related U.S. Application Data

(63) Continuation of application No. 08/366,691, filed on Dec. 30, 1994, now abandoned.

(51) Int. Cl.[7] .................................................. H01L 21/385
(52) U.S. Cl. ........................................... 438/558; 438/561
(58) Field of Search .................................... 438/542, 558, 438/563, 564, 561, 421, 424, 417

(56) References Cited

U.S. PATENT DOCUMENTS

| | | |
|---|---|---|
| 4,433,008 | 2/1984 | Schnable et al. . |
| 4,569,701 | 2/1986 | Oh . |
| 4,579,625 | 4/1986 | Tabata et al. . |
| 4,676,897 | 6/1987 | Lin . |
| 4,782,036 * | 11/1988 | Becker et al. ..................... 438/563 |
| 4,807,012 | 2/1989 | Beason . |
| 4,835,113 | 5/1989 | Celler et al. . |
| 4,961,097 | 10/1990 | Pirastehfar et al. . |
| 5,239,193 | 8/1993 | Benton et al. . |
| 5,246,877 | 9/1993 | Hisamoto et al. . |
| 5,250,837 | 10/1993 | Sparks . |
| 5,268,326 | 12/1993 | Lesk et al. . |
| 5,324,684 * | 6/1994 | Kermani et al. ..................... 438/562 |
| 5,360,987 | 11/1994 | Shibib . |
| 5,395,776 | 3/1995 | Shibib . |
| 5,420,064 | 5/1995 | Dkongi et al. . |

FOREIGN PATENT DOCUMENTS

| | | |
|---|---|---|
| 57-100761 | 6/1982 | (JP) . |
| 59-198756 | 1/1984 | (JP) . |
| 0242767 | 2/1990 | (JP) . |
| 0242768 | 2/1990 | (JP) . |
| 2246168 | 10/1990 | (JP) . |

OTHER PUBLICATIONS

Gammel, J.C., "High Voltages Solid State Relays for Telecommunications" Electro, Session 24, pp. 1–4 (1986).

* cited by examiner

*Primary Examiner*—Savitri Mulpuri

(57) ABSTRACT

A method for uniformly doping a semiconductor surface including non-planar regions. A doped coating material, such as in-situ doped polysilicon or doped glass, is deposited or spread over an etched silicon substrate or wafer. Heat is applied at high temperatures to drive n or p type dopants from the doped coating material into nearby regions of the substrate. In this manner angled or recessed regions of a substrate, such as vertical or angled junction sidewalls in v-groove or trench structures, are uniformly doped.

19 Claims, 4 Drawing Sheets

METHOD OF DOPING A SEMICONDUCTOR SURFACE

This nonprovisional application claims the benefit and is a continuation of U.S. Ser. No. 08/366,691 filed Dec. 30, 1994 now abandoned.

BACKGROUND OF THE INVENTION

1. Field of the Invention

The present invention relates to the field of semiconductor device manufacturing, and more particularly, to a method of forming a uniformly doped layer angled with the respect to a substrate.

2. Related Art

Proper operation of a solid-state device depends, among other things, on the device geometry and the doping profile of the constituent semiconductor layers. Such solid-state devices are typically formed upon a generally planar substrate such as silicon. Impurities or dopants are introduced into semiconductor layers of the substrate to attain a desired doping profile, whereby, for instance, the conductivity of a layer may be enhanced or a pn-junction may be formed.

Certain semiconductor device geometries may require that dopants or impurities be introduced along a portion of a semiconductor region which is angled relative to the base substrate. Applying dopants uniformly along a vertical or angled semiconductor layer, however, is exceedingly difficult under current line-of-sight fabrication techniques.

For instance, during ion-implantation the depth of ion penetration and the uniformity of the resultant doping degenerate when the semiconductor layer is angled away from normal with respect to the bombarding ions. Thus, to dope vertical or angled junction sidewalls, complex tilting operations are required to maintain a perpendicular or near perpendicular angle of incidence.

Further limitations are encountered when doping regions of semiconductor devices which are difficult to access with a straight-line path from the ion source. For instance, narrow junction devices disposed in isolation tubs, e.g. trench or V-groove configurations, contain interior recesses and corners where ion-implantation techniques fail to achieve a sufficiently uniform doping profile.

Accordingly, a fabrication method for introducing dopants uniformly over angled semiconductor regions is desired.

SUMMARY OF THE INVENTION

The present invention is a method of doping a semiconductor surface on a substrate by first applying a doped coating material over the surface, and then driving dopants from the doped coating material into the semiconductor surface to form semiconductor regions which are uniformly doped. According to the present invention, a material containing the dopant source is first spread uniformly to coat the semiconductor regions requiring doping. After this deposition, the material is heated to drive dopants into the semiconductor region. In this manner, non-planar and planar regions of the semiconductor substrate are uniformly doped.

According to a first embodiment of the present invention, in-situ doped polysilicon may be used as the coating material for deposition over an etched silicon substrate surface. The coating material can be deposited directly on the substrate itself (n-type or p-type), or upon oxide layers or doped oxide layers which were previously grown, implanted, or etched on the substrate.

In a second embodiment of the present invention a doped glass layer, e.g. silicon dioxide, is used as the coating material which can be spun and baked, deposited by chemical vapor deposition, or by a plasma process on the silicon wafer to obtain an even distribution across planar and non-planar regions.

According to another aspect of the invention, after dopants are driven from the doped coating material into nearby semiconductor regions further processing can be performed to remove all or part of the coating material, for example, by an anisotropic plasma etching. Furthermore, the coating material itself, e.g. doped polysilicon, can be oxidized to form a dielectric isolation layer which imparts even less stress upon corner regions than direct oxidation of the etched corner layer.

The present invention then applies generally to the manufacture of semiconductor devices, and in particular, is well-suited for forming uniformly doped non-planar sides of dielectrically-isolated (DI) or silicon-on-isolator (SOI) structures including the non-planar regions found in wrap-around or vertical junctions with a trench or v-groove geometry.

Finally, the present invention can be further advantageously used in the fabrication of a semiconductor photodiode with a uniformly doped wrap around junction and in a double-diffused MOS (DMOS) manufacturing process where a high voltage switch such as an insulated gate bipolar transistor (IGBT) is fabricated along with the uniformly doped semiconductor photodiode.

BRIEF DESCRIPTION OF THE DRAWINGS

The invention will be better understood if reference is made to the accompanying drawings in which.

DETAILED DESCRIPTION OF THE PREFERRED EMBODIMENTS

Figure 1A:
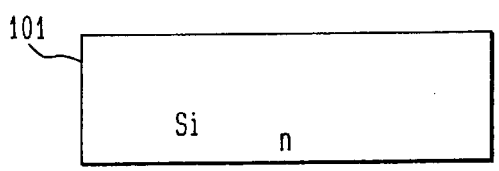
FIGS. 1(a)–4(e) show progressive stages for uniformly doping semiconductor devices in trenches or v-grooves according to the present invention.
Figure 1B:
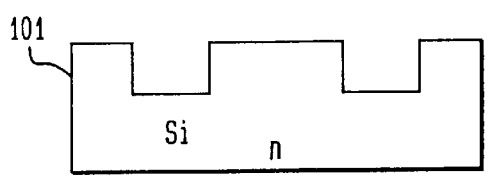
Figure 1C:
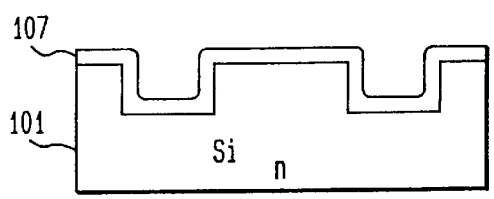
Figure 1D:
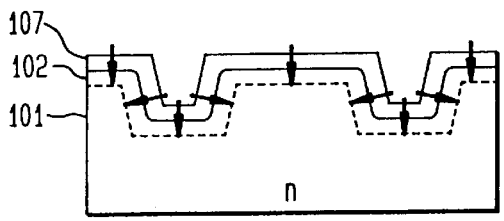
Figure 1E:
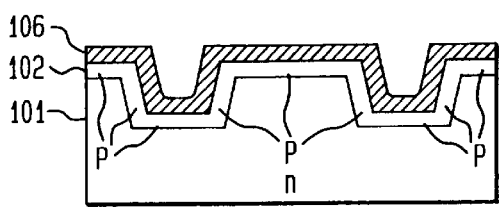
Figure 2A:
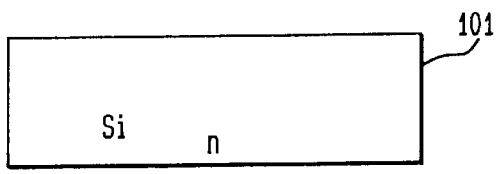
Figure 2B:
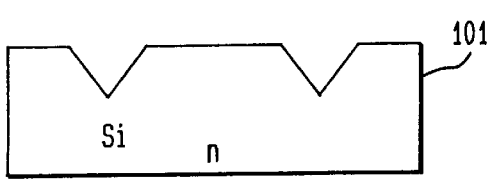
Figure 2C:
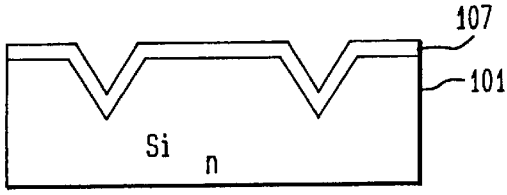
Figure 2D:
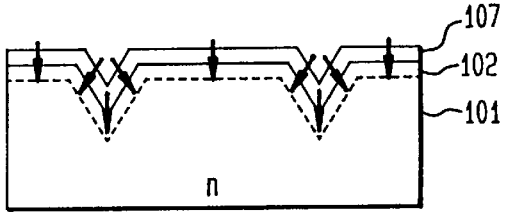
Figure 2E:
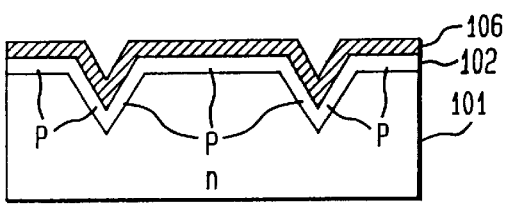
Figure 3A:
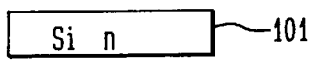
Figure 4A:
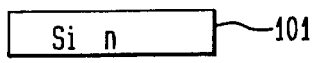
Figure 3B:
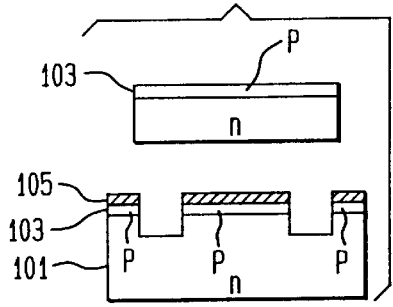
Figure 4B:
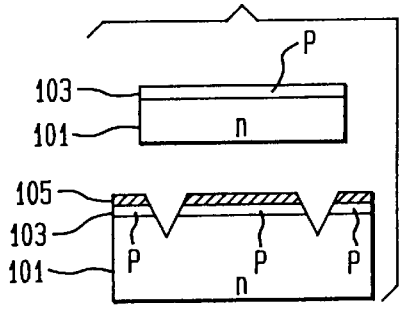
Figure 3C:
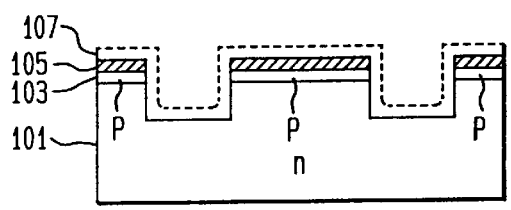
Figure 4C:
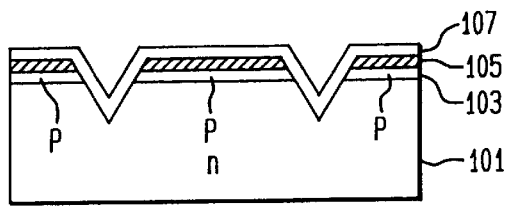
Figure 3D:
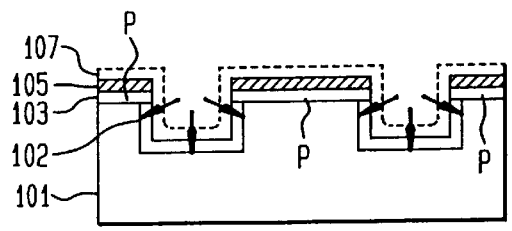
Figure 4D:
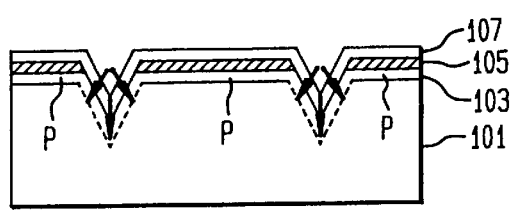
Figure 3E:
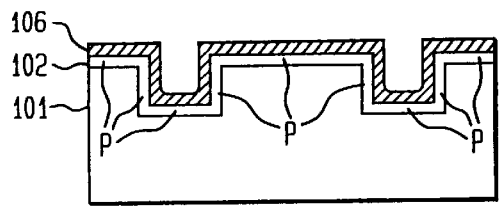
Figure 4E:
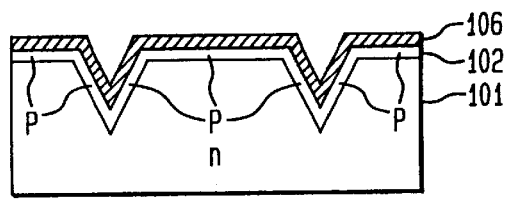

The preferred embodiments of the present invention are discussed in detail below. While specific steps, configurations and arrangements are discussed, it should be understood that this done for illustration purposes only. A person skilled in the relevant art will recognize that other steps, configurations and arrangements may be used without departing from the spirit and scope of the invention. The preferred embodiments of the invention are now described with reference to the figures where like reference numbers indicate identical or functionally similar features.

FIGS. 1(a)–2(e) and 3(a)–4(e) each show a method of uniformly doping non-planar regions of a semiconductor substrate layer according to a preferred embodiment of the present invention. The rows in FIGS. 1(a)–2(e) and 3(a)–4(e) depict the progressive steps in the manufacture of a trench solid-state device (left column) and a v-groove solid-state device (right column).

Steps (a) to (b) in FIGS. 1(a)–2(e) and 3(a)–4(e) show conventional fabrication steps for forming planar semiconductor layers on a silicon n-type substrate or wafer 101. In FIGS. 1(a)–2(e), the n-type silicon substrate 101 shown in step (a) is etched to form trench and v-groove regions as shown in step (b).

Alternatively, further planar techniques can be performed according to the particular semiconductor device being made. For example, step (b) in FIGS. 3(a)–4(e) shows including additional steps of implanting to form a planar doped p-layer 103 and oxidizing to form a planar oxide layer 105 on the p-layer 103. Trench and v-groove regions are shaped on the backside of the substrate or wafer 101 through etching, e.g. wet or plasma etching, as in FIGS. 1(a)–2(e). Such techniques in silicon technology for forming planar doped layers and for oxidizing and etching to control the lateral trench or v-groove geometry are well-known and described, for example, in two books by S.M. Sze: *Physics of Semiconductor Devices, John Wiley and Sons, Inc., New York,* 1981, and *Semiconductor Devices, Physics and Technology, John Wiley and Sons, Inc., New York,* 1985, both of which are incorporated herein by reference.

As will be made evident in the following description of steps (c) to (e) in FIGS. 1(a)–4(e), according to the present invention planar and non-planar regions of the etched semiconductor surface of the substrate 101 can now be uniformly doped by applying a doped coating material and driving dopants into the semiconductor regions. In the first embodiment of the present invention, a layer of in-situ doped polysilicon 107 is deposited over the etched surface of the n-type silicon substrate or wafer 101 including the non-planar regions (FIGS. 1(a)–4(e), step c). The doped polysilicon coating material 107 is preferably deposited through low pressure chemical vapor deposition to obtain a uniform coating.

Thus, the doped coating material 107 is uniformly spread over planar and non-planar regions of the silicon surface of substrate 101 in FIGS. 1(a)–2(e), step (c). Likewise, in Fig. 3(a)–4(e), step (c) the coating material 107 is deposited evenly over the etched n-type silicon substrate 101, planar p-type layer 103, and a planar oxide layer 105. Other variations, however, are clearly within the scope of the invention. For example, the doped coating material 107 can also be applied directly upon an oxide layer and/or a doped oxide layer.

Next, in step (d) of FIGS. 1(a)–4(e), heat is applied to drive dopants from the doped polysilicon coating material 107 into nearby planar and non-planar regions of the semiconductor substrate or wafer 101 to form a p-layer 102 having a uniform doping profile including the corners and sides of the trench and v-groove regions (see step (e)).

Temperatures between 800° to 1200° Celsius are sufficient to drive dopants from the polysilicon material 107 into the semiconductor silicon substrate 101. Drive-in temperatures below 800° C. and above 1200° C., however, are also well-within the purview of the invention depending upon the particular dopant, coating material, semiconductor region, and the degree of doping or conductivity enhancement that is required.

A variety of dopant concentrations in the doped coating material and in the substrate may be used to generate different junction combinations. First, p-type dopants such as boron, or n-type dopants, such as phosphorus or arsenic, may be utilized to dope the polysilicon coating material 107. The dopant concentration of the newly created layer 102 can be heavy, moderate, or light depending upon the relative concentration of p or n type dopants injected during the driving step into the substrate. Likewise, the p-type or n-type silicon substrates themselves may be doped lightly, moderately, or heavily.

For example, p type dopants can be driven into an n-type substrate to form the following junctions:
(1) a p/n, p−/n, or p+/n junction, where the n-type substrate n is moderately doped;
(2) a p/n−, p−/n−, or p+/n− junction, where the n-type substrate n− is lightly doped; or
(3) a p/n+, p−/n+, or p+/n+ junction, where the n-type substrate n+ is heavily doped.

N-type dopants can also be driven into a lightly or moderately doped n-type substrate to change the conductivity, thereby, creating n/n− and n+/n combinations. Similar combinations are possible when using p-type substrates by switching the above n and p type dopants and substrates.

After the high temperature drive-in step (d), further processing can be performed to fabricate the desired solid-state devices within the trench and v-groove regions. As shown in step (e), the in-situ doped polysilicon may be allowed to oxidize to form a dielectric isolation layer 106. Alternatively, the polysilicon layer can be partially or fully removed through etching techniques such as isotropic or anisotropic plasma etching, or silicide (not shown) can be added to the polysilicon to form a contact such as a MOSFET gate. Allowing the doped polysilicon layer to oxidize is especially advantageous, however, as it lowers the stress that results from the direct oxidization of the etched corner layer.

According to a second preferred embodiment, a doped glass-type coating material is used instead of doped polysilicon. This glass layer, i.e. amorphous silicon dioxide, is softer than polysilicon and can be applied uniformly across a semiconductor surface through spin-on glass and baking techniques, chemical vapor deposition, or a plasma process. As with the polysilicon material, the glass material can include p-type or n-type dopants for injection into a n-type or p-type silicon substrate to form the desired junctions and desired dopant concentrations.

Compared to the polysilicon drive-in temperatures, relatively lower temperatures between 400° to 800° Celsius are sufficient to drive dopants from the glass material into the semiconductor silicon substrate—although temperatures outside the 400–800° range may be used depending upon the particular application. After the drive-in step subsequent fabrication proceeds as described previously with respect to the polysilicon material depending upon the particular solid state device being fabricated.

Semiconductor Photodiode Fabrication

The method of uniformly doping a semiconductor region is particularly well-suited for forming wrap-around or vertical junctions as used in a semiconductor photodiode device and a double-diffused MOS (DMOS) process as described in the inventor's previous, commonly-assigned U.S. Pat. No. 5,360,987 issued Nov. 1, 1994 (incorporated herein by reference).

Figure 5:
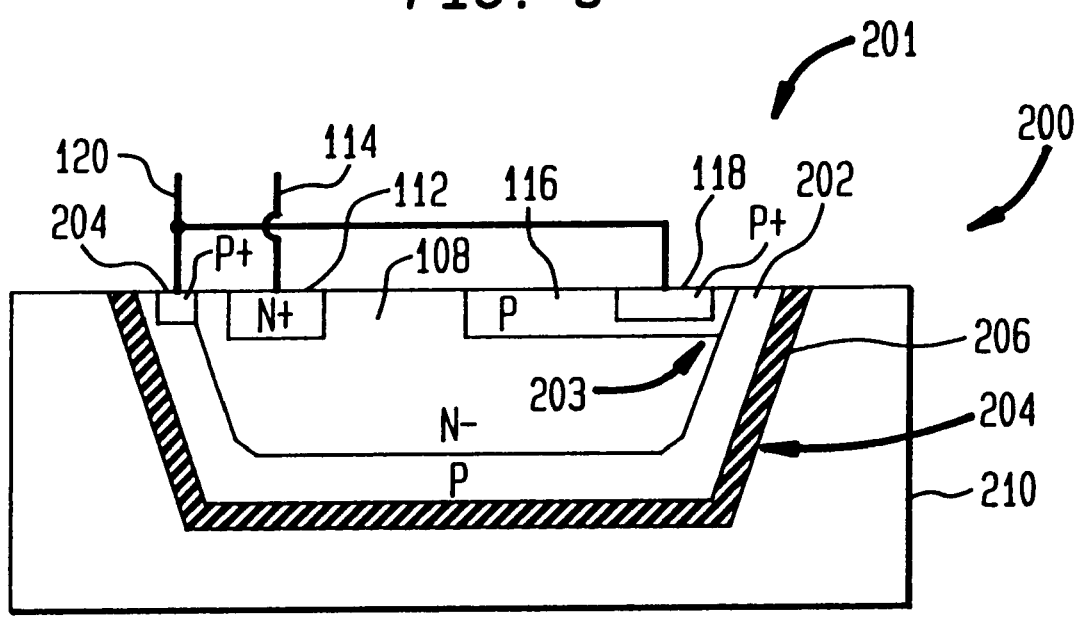
FIG. 5 shows a semiconductor photodiode having a wrap-around junction which is uniformly doped according to the present invention.

FIG. 5 shows a semiconductor photodiode having a wrap-around junction uniformly doped according to the present invention as described above. Thus, the driving step (d) of FIGS. 1(a)–4(e) is used to drive p-type dopants into a lightly-doped n-substrate to form a moderately doped backside wrap-around anode region 202 which extends the collection area of the photodiode. Afterwards, the doped coating material, e.g., polysilicon or glass, is allowed to oxidize as in step (e) of FIGS. 1(a)–4(e) to form the dielectric isolation 206. A second substrate 210 is provided on the dielectric isolation layer 206 to support the semiconductor photodiode 200 at a tub 204.

Finally, the other anode and cathode regions of the semiconductor photodiode itself are fabricated on the lightly doped n- substrate 201 upon the wrap-around layer 202 according to conventional planar silicon fabrication methods such as diffusion and implantation. As shown in FIG. 5, anode 120 is made by fabricating a moderately doped p anode region 116 and a more heavily doped region p + 204, each region being electrically connected to the moderately doped p-type backside wrap-around anode region 202. A more heavily doped p+ anode region 118 is further diffused or implanted within the moderately doped p region 116. Similarly, the cathode 114 includes a heavily doped n+ cathode region 112 formed from the lightly doped n-type substrate n– 201 at cathode region 108 by introducing n-type impurities through diffusion or implantation.

According to the present invention photodiodes can also be formed in silicon-on-insulator (SOI) type structures having vertical trenches as described before with respect to FIGS. 1(a)–4(e).

Figure 6:
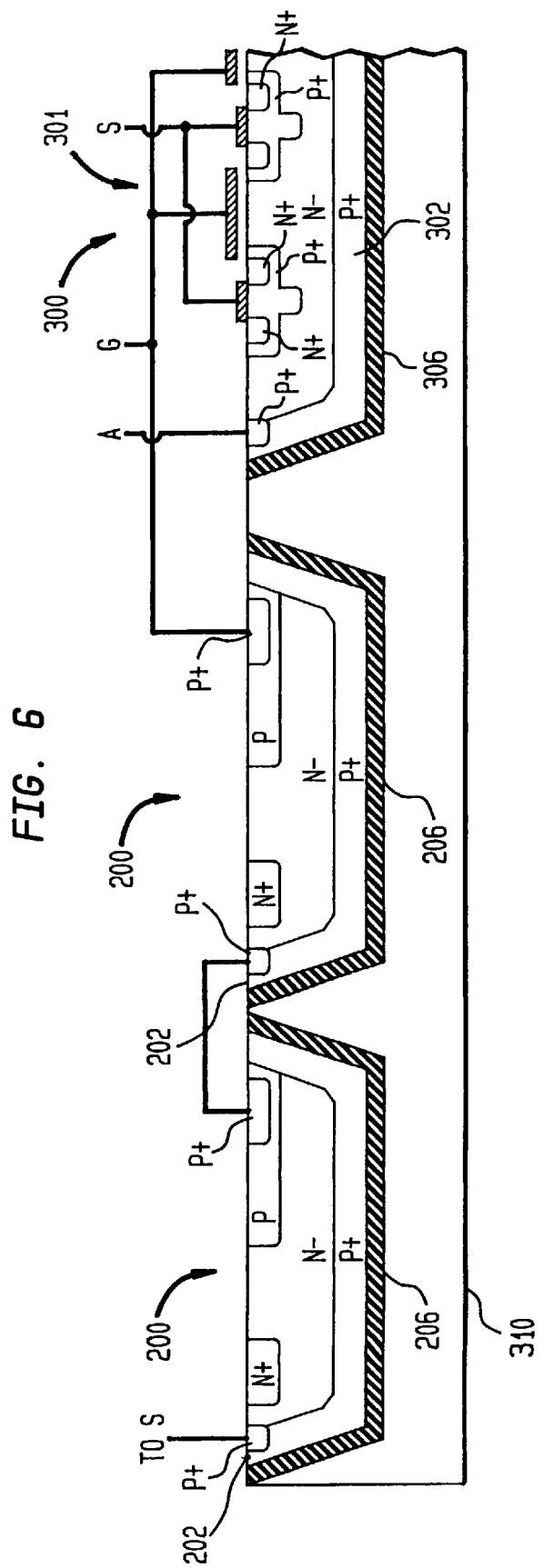
FIG. 6 shows a solid-state relay having a wrap-around layer which is uniformly doped according to the present invention.

FIG. 6 shows a solid-state relay using two semiconductor photodiodes 200 each having a backside wrap-around anode junction 202 which is uniformly doped at a heavy concentration according to the process of the present invention as previously described with respect to FIGS. 1(a)–2(e), 3(a)–4(e) and 5. FIG. 6 further includes an insulated gate bipolar transistor (IGBT) 300 fabricated to have a wrap-around layer 302 which is also uniformly doped at a heavy concentration p+ according to the method of the present invention, that is, by applying a doped coating material and then driving dopants at high temperature into a lightly doped n– substrate. Thus, the driving step (d) of FIGS. 1(a)–4(e) is used to drive p-type dopants to simultaneously form the backside wrap-around anode regions 202, 302 for each photodiode 200 and for the IGBT 300 respectively.

Through oxidizing the isolation layers 206 and 306 are formed simultaneously as well. A second substrate 310 is then applied to support the entire structure. Finally, the other anode and cathode regions of the semiconductor photodiodes and the gate, anode, and source regions of the IGBT are fabricated as shown in FIG. 6 on the lightly doped n– substrate 301 according to conventional planar silicon fabrication methods such as diffusion and implantation.

While various embodiments of the present invention have been described above, it should be understood that they have been presented by way of example, and not limitation. It will be apparent to persons skilled in the relevant art that various changes in form and detail may be made therein without departing from the spirit and scope of the invention. Thus, the present invention should not be limited by any of the above-described exemplary embodiments, but should be defined only in accordance with the following claims and their equivalents. All cited patent documents and publications in the above description are incorporated herein by reference.

What is claimed is:

1. A method for selectively doping a semiconductor substrate having a surface including a planar area and a non-planar area including sidewalls, the planar area having a first planar area portion and a second planar area portion, the method comprising the steps of:
   forming a planar doped layer on the semiconductor surface at the planar area, the planar doped layer not being formed on the sidewalls;
   forming an oxide material on the planar doped layer over the planar area;
   applying a coating material comprising dopats over the oxide material to form a dopant material coating; and
   heating the semiconductor substrate, the oxide material and the dopant material coating for at least a sufficient amount of time to cause the dopants to migrate from the dopant material coating into the semiconductor substrate defined by the non-planar area to form a doped semiconductor region extending from the surface of the semiconductor substrate where the non-planar area is located and into the semiconductor substrate, the oxide layer preventing migration of the dopants into the first planar area portion of the planar area.

2. The method according to claim 1, wherein the oxide material covers the entire first planar are a portion.

3. The method according to claim 1, wherein the dopant material coating has a substantially uniform thickness, the thickness measured between an upper surface of the dopant material coating and the non-planar area and the second planar area portion of the semiconductor substrate.

4. The method according to claim 1, wherein the doped semiconductor region is substantially uniform.

5. The method according to claim 1, wherein the doped semiconductor region is doped differently than the first planar area portion.

6. A method for selectively doping a semiconductor substrate having a surface including a planar area and a non-planar area, the method comprising:
   forming a planar doped layer on the semiconductor surface at the planar area;
   forming an oxide material on the planar doped layer covering the planar area of the surface;
   applying a coating material comprising dopants over the oxide material and on the planar and non-planar areas of the semiconductor substrate to form a dopant material coating; and
   heating the semiconductor substrate, the oxide material and the dopant material coating for at least a sufficient amount of time to cause the dopants to migrate from the dopant material coating into the semiconductor substrate defined by the non-planar area to form a doped semiconductor region extending from the surface of the semiconductor substrate where the non-planar area is located and into the semiconductor substrate, and the oxide material preventing migration of the dopants into the planar area.

7. The method according to claim 6, wherein the dopant material coating has a substantially uniform thickness, the thickness measured between an upper surface of the dopant material coating and the surface of the semiconductor substrate.

8. The method according to claim 7, wherein the doped semiconductor region is substantially uniform.

9. The method according to claim 7, wherein the doped semiconductor region is doped differently than the planar area of the semiconductor substrate.

10. The method according to claim 1, wherein the dopant material coating is formed by chemical vapor deposition.

11. The method according to claim 6, wherein the dopant material coating is formed by chemical vapor deposition.

12. The method according to claim 1, wherein the second planar area portion is free of the planar doped layer.

13. The method according to claim 6, wherein the non-planar area is free of the planar doped layer.

14. The method according to claim 1, wherein the dopant of the coating material is phosphorus or arsenic.

15. The method according to claim 6, wherein the dopant of the coating material is phosphorus or arsenic.

16. The method according to claim 1, wherein the dopant material coating comprises amorphous silicon dioxide.

17. The method according to claim 6, wherein the dopant material coating comprises amorphous silicon dioxide.

18. A method for selectively doping a semiconductor substrate having a surface including a planar area and a non-planar area, the method comprising:

forming a planar doped layer only on the planar area of the surface of the semiconductor substrate;

forming an oxide material only on the planar doped layer;

depositing a coating material comprising dopants uniformly onto the oxide material and on the non-planar area of the surface to form a uniform dopant material coating, the dopants comprising arsenic or phosphorus; and heating the semiconductor substrate, the planar doped layer, the oxide material and the dopant material coating for at least a sufficient amount of time to cause the dopants to migrate from the dopant material coating into the semiconductor substrate defined by the non-planar area to form a doped semiconductor region extending from the surface of the semiconductor substrate where the non-planar area is located and into the semiconductor substrate, the oxide material preventing migration of the dopants into the planar area.

19. The method according to claim 18, wherein the dopant material coating comprises amorphous silicon dioxide.

* * * * *